United States Patent [19]

Trevail et al.

[11] 3,924,323

[45] Dec. 9, 1975

[54] METHOD OF MAKING A MULTIPLICITY OF MULTIPLE-DEVICE SEMICONDUCTOR CHIPS AND ARTICLE SO PRODUCED

[75] Inventors: Lewis Herbert Trevail, Indianapolis; Brian Anthony Hegarty, Martinsville, both of

[73] Assignee: RCA Corporation, New York, N.Y.

[22] Filed: Aug. 23, 1974

[21] Appl. No.: 500,164

Related U.S. Application Data

[62] Division of Ser. No. 355,718, April 30, 1973, abandoned.

[52] U.S. Cl. .......... 29/583; 29/580

[51] Int. Cl.² .......... B01J 17/00

[58] Field of Search .......... 29/583, 580, 576 IW, 577

[56] References Cited

UNITED STATES PATENTS

| | | | |
|---|---|---|---|
| 2,748,041 | 5/1956 | Leverenz | 29/583 |
| 3,343,255 | 9/1967 | Donovan | 29/583 |
| 3,411,200 | 11/1968 | Formigoni | 29/576 IW |
| 3,689,357 | 9/1972 | Jordan | 29/583 |

*Primary Examiner*—W. Tupman

*Attorney, Agent, or Firm*—Glenn H. Bruestle; William S. Hill

[57] ABSTRACT

A multiplicity of semiconductor devices are made in a semiconductor wafer or slice. Grooves are made in the back of the slice such that individual devices are separated. The grooves preferably do not extend completely through the slice. The grooves are then filled with resin, isolating the devices and the backside of the slice is also coated with resin. Later, the remainder of the semiconductor material opposite each groove is removed and the slice is divided so that each chip unit has a plurality of isolated devices.

7 Claims, 7 Drawing Figures

METHOD OF MAKING A MULTIPLICITY OF MULTIPLE-DEVICE SEMICONDUCTOR CHIPS AND ARTICLE SO PRODUCED

This is a division of application Ser. No. 355,718, filed Apr. 30, 1973, now abandoned.

BACKGROUND OF THE INVENTION

Microminiature semiconductor circuits of the so-called "hybrid" type, usually include a ceramic substrate having an array of conductors and passive components such as resistors and capacitors printed thereon, and also active circuit components, such as transistors and diodes, mounted on terminal pads on the substrate. The printing of the conductors and passive components is a relatively inexpensive part of the manufacturing operation since those parts of the circuit can be deposited with a few strokes of an ink applying squeegee. However, the mounting of the active devices has been relatively expensive because each device has been handled individually during the mounting operation.

Many circuits include more than one active device and, although it would be desirable to place several such devices on a single semiconductor chip, it is well known that when a plurality of active devices are closely spaced on a semiconductor chip, there are unwanted parasitic reactions between devices. A common method of electrically isolating devices on a single chip is to diffuse impurities of the proper type between the devices. This is effective to a certain extent but the diffused materials, themselves, introduce parasitics and the isolation is not 100 percent effective.

It would be desirable to have a method which would permit a plurality of devices to be placed on a single chip so that the costs of handling the active devices would be decreased, and, at the same time, have more complete isolation of each device such as when each semiconductor chip contains only one device.

THE DRAWING

DESCRIPTION OF PREFERRED EMBODIMENT

One aspect of the present invention is a method which enables one to economically manufacture, test, and mount a multiplicity of unit semiconductor chips, each containing a plurality of active semiconductor devices. In each unit chip, the individual devices are substantially completely electrically isolated from each other by a dielectric substance, such as a synthetic resin.

Figure 1:
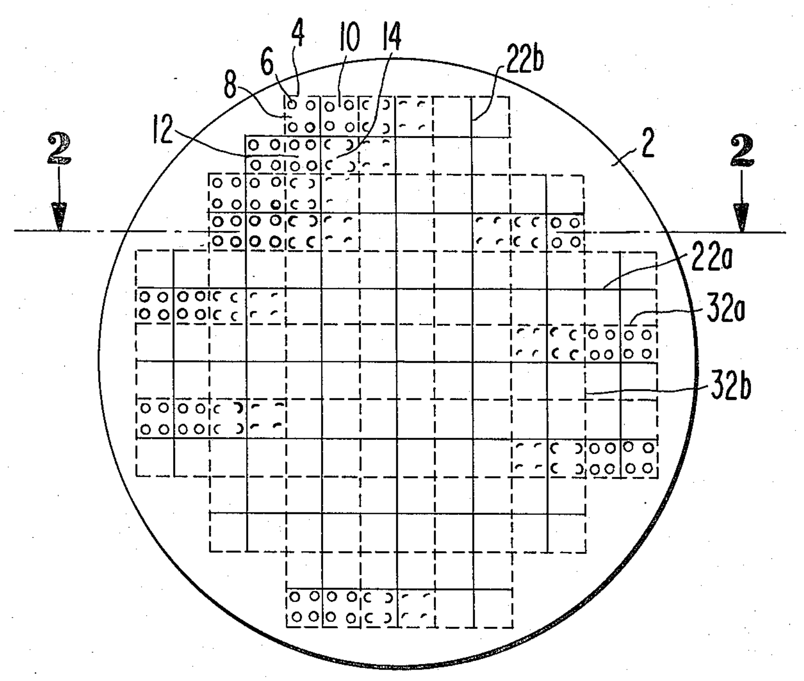
FIG. 1 is a plan view of a semiconductor crystal slice or wafer containing a multiplicity of active semiconductor devices which are later to be separated into a large number of unit chips each of which contains a plurality of devices.

Referring to FIG. 1, there is shown a semiconductor wafer 2 having a multiplicity of active semiconductor devices 4 fabricated therein by the usual techniques of diffusion and deposition of contact metals. As illustrated, each device 4 has four solder bump terminals 6 which are to be connected to suitable bonding pads in a hybrid circuit (not shown) which has been printed on one surface of a ceramic substrate. Although all devices have been illustrated as having four terminals, some of the devices in the wafer 2 may have a greater or a lesser number of terminals, e.g. three or five. Also, although all of the devices can be the same, it is more likely that some of the devices will be transistors and that some will be diodes, and that the transistors will be of more than one type.

Previously, in utilizing an array such as that illustrated, it was common practice to separate all of the individual units by sawing and mounting each one separately where it was needed in the circuit. However, as soon as the wafer is cut up into individual devices, handling costs increase greatly.

It is intended that the wafer 2 be subdivided into a multiplicity of unit chips each of which contains a number of, e.g., four, devices such as the group of devices 8, 10 12 and 14 in one corner of the device array. It is intended that all of the devices in a single chip can be utilized in a single circuit or part of a circuit.

Figure 2:
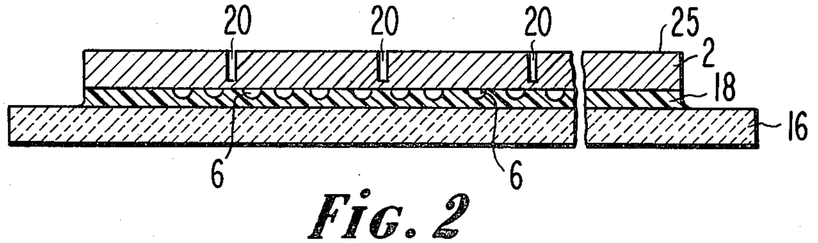
FIG. 2 is a cross-section view of the wafer of FIG. 1 when the wafer is mounted face down on a temporary substrate.
Figure 3:
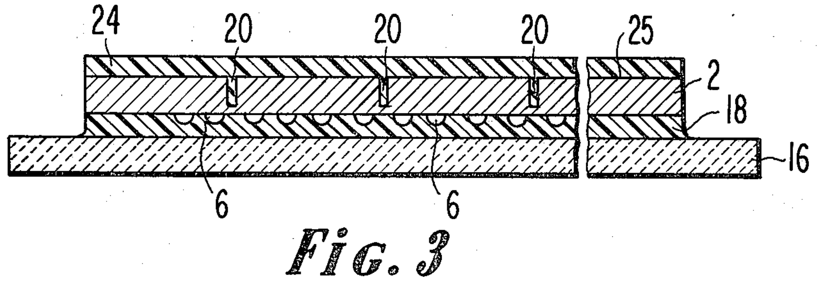
FIGS. 3–7 are cross-section views illustrating successive steps in manufacturing unit chips which are to be separately mounted in hydrid circuits.

The first step of the present method is to mount the wafer 2, contact face down, on a temporary substrate 16, with a layer of wax 18 or other readily soluble adhesive. The back face of the wafer is then provided with a gridwork of grooves 20 (FIG. 2) which are cut along the solid horizontal lines 22*a* and the solid vertical lines 22*b* as indicated in FIG. 1. Preferably these grooves do not extend completely through the wafer, which may have a thickness of 8–10 mils, for example. One or two mils of semiconductor material remain at the bottom of each groove.

Figure 4:
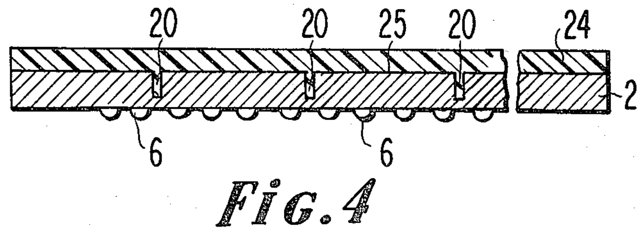
Figure 5:
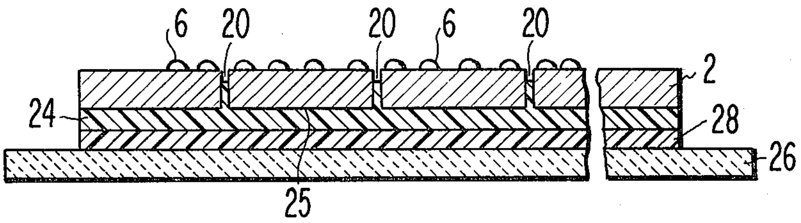

A coating of epoxy resin 24 (or other resin which is not soluble in the same solvents to be used for the wax layer 18) is then spread over the entire back face 25 of the wafer and into the grooves 20 so that the grooves are filled with resin. Although the grooves 20 could extend completely through the wafer at this point, there is danger that the resin in the grooves may spread somewhat over the front face of the wafer making it necessary to later remove it. After the resin is hardened, the wafer 2 is separated from the temporary substrate 16 by dissolving the wax layer 18, as indicated in FIG. 4. Then, (FIG. 5), the wafer 2 is mounted with its back face 25 upon another temporary substrate 26, with a layer of wax 28. The semiconductor material opposite the grooves 20 above the resin which is in the grooves, is then removed by sawing so that there will be substantially complete isolation between devices.

Figure 6:
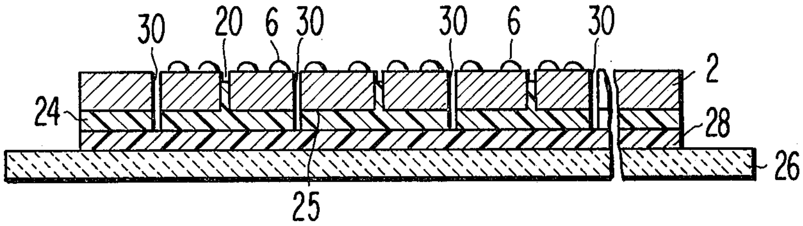

The next step (FIG. 6) is to cut another set of grooves 30 extending completely through the semiconductor wafer 2 and through the resin layer 24 along the dotted horizontal lines 32*a* and the dotted vertical lines 32*b* as shown in FIG. 1. This grid work of cuts now divides the array of unit chips into individual pieces, but all are still held as a unit on the substrate 26 by the adhesive (wax) layer 28. In this stage, the assembly can readily be handled for processing such as testing some or all of the individual devices using probes in conventional manner.

Figure 7:
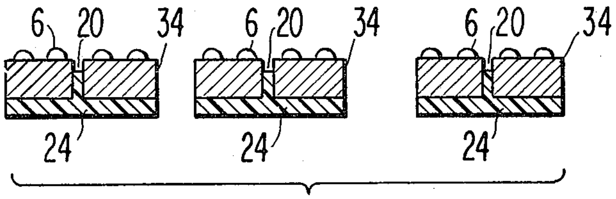

Complete separation of the unit chips is accomplished by merely dissolving the wax layer 28. As shown in FIG. 7, individual unit chips 34 are now ready to be mounted face down on bonding pads in a hydrid circuit. The resin between the devices and on the back surface of the chip is sufficiently thick and strong to make each chip self-supporting.

The method which has been described enables all the devices of a single circuit or of some particualr part of a circuit to be handled as a single chip during the assembly operation and still provides substantially complete electrical isolation between .each device. The number of devices on each unit chip can, of course, be varied. Each unit chip may contain only two devices, for example, or it may contain more than the number illustrated herein.

Another aspect of the present invention is that it provides an improved article comprising a multiplicity of device units oriented in a plane, each unit of which contains a plurality of devices all dielectrically isolated from each other at their edges, where all the units are held together on a temporary substrate and can thus be handled for testing as a single assembly. The assembly can be shipped in this form to an apparatus manufacturer who can then re-test and separate the device units by dissolving an adhesive layer.

Still another aspect of the invention is that it provides a unit in which a plurality of devices are adhered together at their edges in oriented fashion so that they may be handled as a group and mounted in a circuit as a group. This unit has the further advantage that all the devices of the unit have come from the same part of the same semiconductor crystal slice and have been subject to the same processing. This results in all the devices being much more precisely matched than if they had been assembled from different crystal slices. This is of considerable advantage to the circuit designer and electronic apparatus manufacturer.

We claim:

1. A method of fabricating a multiplicity of semiconductor unit chips each of which contains a plurality of substantially completely electrically isolated semiconductor devices, comprising:

forming an array of devices within a single wafer of semiconducting material, each of said devices having one face on which circuit contacts are adapted to be formed and another face opposite thereto, mounting said wafer on a temporary substrate with said contact face facing said substrate, forming grooves in said opposite wafer face between some but not all of said devices, filling said grooves with and coating said opposite surface with, a resin, removing said wafer from said substrate, remounting said wafer on a substrate with said opposite face facing said last mentioned substrate, dividing said wafer between devices which do not have grooves therebetween such that said wafer is divided into said unit chips, and separating said unit chips with said devices in each unit chip being electrically isolated from one another by the resin in the grooves from the substrate.

2. A method according to claim 1 in which test operations are performed on the devices of said divided wafer after the wafer is divided in said ungrooved areas.

3. A method according to claim 1 in which said grooves extend entirely through said wafer.

4. A method according to claim 1 in which said grooves at first extend only partially through said wafer and then, after said resin is applied, the remainder of the semiconductor material opposite said grooves is removed.

5. A method according to claim 1 in which said wafer is mounted on the substrate with a layer of wax.

6. A method according to claim 1 in which said grooves are formed by sawing.

7. A method according to claim 1 in which said wafer is divided into unit chips after the wafer is re-mounted on a substrate by making a gridwork of saw-cuts which extend through said opposite coating or resin.

* * * * *

UNITED STATES PATENT OFFICE

CERTIFICATE OF CORRECTION

PATENT NO. : 3,924,323

DATED : December 9, 1975

INVENTOR(S) : Lewis Herbert Trevail & Brian Anthony Hegarty

It is certified that error appears in the above-identified patent and that said Letters Patent are hereby corrected as shown below:

Claim 1, col. 4, line 16, after "chips", before the comma insert -- with said devices in each unit chip being electrically isolated from one another by the resin in the grooves --.

Signed and Sealed this

*second* Day of *March 1976*

[SEAL]

*Attest:*

RUTH C. MASON
*Attesting Officer*

C. MARSHALL DANN
*Commissioner of Patents and Trademarks*